United States Patent
Xu et al.

(10) Patent No.: US 10,586,875 B2
(45) Date of Patent: Mar. 10, 2020

(54) GATE-ALL-AROUND TRANSISTOR BASED NON-VOLATILE MEMORY DEVICES

(71) Applicant: INTERNATIONAL BUSINESS MACHINES CORPORATION, Armonk, NY (US)

(72) Inventors: Zheng Xu, Wappingers Falls, NY (US); Zhenxing Bi, Niskayuna, NY (US); Dexin Kong, Guilderland, NY (US); Qianwen Chen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/026,880

(22) Filed: Jul. 3, 2018

(65) Prior Publication Data

US 2020/0013896 A1 Jan. 9, 2020

(51) Int. Cl.
| | |
|---|---|
| *H01L 29/788* | (2006.01) |
| *H01L 27/11521* | (2017.01) |
| *H01L 29/06* | (2006.01) |
| *H01L 29/423* | (2006.01) |
| *H01L 29/66* | (2006.01) |
| *H01L 29/49* | (2006.01) |
| *H01L 29/786* | (2006.01) |
| *H01L 21/28* | (2006.01) |

(52) U.S. Cl.
CPC .... *H01L 29/7883* (2013.01); *H01L 27/11521* (2013.01); *H01L 29/0673* (2013.01); *H01L 29/40114* (2019.08); *H01L 29/42324* (2013.01); *H01L 29/42392* (2013.01); *H01L 29/4908* (2013.01); *H01L 29/66742* (2013.01); *H01L 29/66825* (2013.01); *H01L 29/78696* (2013.01)

(58) Field of Classification Search
CPC ........... H01L 29/7883; H01L 29/42392; H01L 29/66742; H01L 21/28273; H01L 29/78696; H01L 29/66825; H01L 29/42324; H01L 29/0673; H01L 27/11521; H01L 29/4908
See application file for complete search history.

(56) References Cited

U.S. PATENT DOCUMENTS

| | | |
|---|---|---|
| 8,779,495 B2 | 7/2014 | Happ et al. |
| 8,779,499 B2 | 7/2014 | Kiyotoshi |
| 8,937,346 B2 | 1/2015 | Aritome |

(Continued)

OTHER PUBLICATIONS

Sungjin Whang et al Novel 3-Dimensional Dual Control-Gate with Surrounding Floating-Gate (DC-SF) NAND Flash Cell for 1Tb File Storage Application 2010 International Electron Devices Meeting Jan. 28, 2011 pp. 29.7.2-29.7.4 IEEE.

*Primary Examiner* — Victor A Mandala
(74) *Attorney, Agent, or Firm* — Tutunjian & Bitetto, P.C.; Vazken Alexanian

(57) ABSTRACT

A method for fabricating a semiconductor device including a gate-all-around based non-volatile memory device includes forming gate-all-around field effect transistor (GAA FET) channels, depositing tunnel dielectric material around the GAA FET channels to isolate the GAA FET channels, forming a floating gate, including depositing first gate material over the isolated GAA FET channels, and forming at least one control gate, including depositing second gate material over the isolated GAA FET channels.

9 Claims, 10 Drawing Sheets

(56) References Cited

U.S. PATENT DOCUMENTS

| | | | |
|---|---|---|---|
| 8,952,441 B2 | 2/2015 | Sakuma et al. | |
| 8,987,801 B2 | 3/2015 | Sakui | |
| 9,478,643 B2 | 10/2016 | Hopkins et al. | |
| 9,691,907 B1 | 6/2017 | Huang | |
| 9,899,398 B1 | 2/2018 | Colinge et al. | |
| 2002/0154556 A1* | 10/2002 | Endoh | H01L 27/115 365/200 |
| 2005/0224847 A1* | 10/2005 | Masuoka | H01L 27/115 257/288 |
| 2008/0237575 A1 | 10/2008 | Jin et al. | |
| 2013/0309826 A1* | 11/2013 | Ramkumar | H01L 29/4234 438/269 |
| 2015/0041879 A1* | 2/2015 | Jayanti | H01L 27/11556 257/324 |
| 2015/0131381 A1* | 5/2015 | Rhie | G11C 16/14 365/185.17 |
| 2018/0033797 A1* | 2/2018 | Colinge | H01L 29/42332 |
| 2018/0366564 A1* | 12/2018 | Levy | G11C 16/0466 |

\* cited by examiner

GATE-ALL-AROUND TRANSISTOR BASED NON-VOLATILE MEMORY DEVICES

BACKGROUND

Technical Field

The present invention generally relates to semiconductor devices, and more particularly to gate-all-around field-effect transistor devices and methods of fabricating the same.

Description of the Related Art

A gate-all-around (GAA) field effect transistor (FET) is a FET in which the gate is placed on all four sides of a channel of the FET. GAA FETs can reduce problems associated with channel width variations, including but not limited to undesired variability and mobility loss.

Non-volatile memory (NVM) is a type of computer memory that can retrieve stored information even after having been power cycled. Examples of non-volatile memory include, but are not limited to, (programmable) read-only memory (ROM), flash memory (e.g., NOR flash and NAND flash), ferroelectric RAM, hard disk drives (HDDs), solid state drives (SDDs), floppy disks, magnetic tape, and optical discs. NOR flash memory can provide high-speed random access, reading and writing data in specific memory locations. NAND flash memory can read and write sequentially at high speed, handling data in small blocks called pages, but reads slower as compared to NOR flash memory. NAND flash memory reads faster than it writes, thereby rapidly transferring whole pages of data.

SUMMARY

In accordance an embodiment of the present invention, a method for fabricating a semiconductor device including a gate-all-around based non-volatile memory device is provided. The method includes forming gate-all-around field effect transistor (GAA FET) channels, depositing tunnel dielectric material around the GAA FET channels to isolate the GAA FET channels, forming a floating gate, including depositing first gate material over the isolated GAA FET channels, and forming at least one control gate, including depositing second gate material over the isolated GAA FET channels.

In accordance with another embodiment of the present invention, a semiconductor device including a gate-all-around based non-volatile memory device is provided. The device includes isolated channels including tunnel dielectric material disposed around gate-all-around field effect transistor (GAA FET) channels, a floating gate including a first gate material encapsulating the isolated channels, and dual control gates including a second gate material encapsulating the isolated channels.

In accordance with another embodiment of the present invention, a semiconductor device including a gate-all-around based non-volatile memory device is provided. The device includes a isolated channels including tunnel dielectric material disposed around gate-all-around field effect transistor (GAA FET) channels, at least one floating gate including at least one portion of first gate material encapsulating at least one of the isolated channels, a dielectric layer conformally formed around the at least one portion of first gate material, and a control gate including a second gate material encapsulating the dielectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
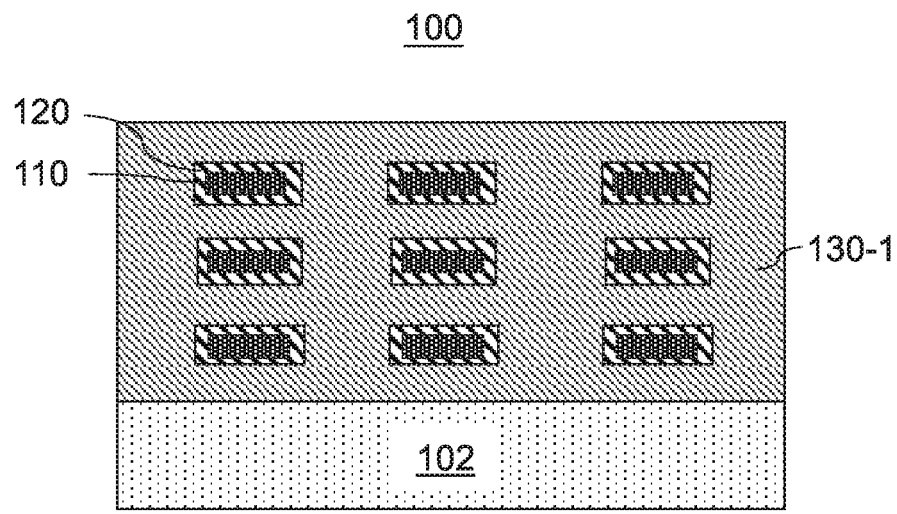
FIG. 1 is a cross-sectional view of a semiconductor device taken transversely across fins through a control gate, in accordance with an embodiment of the present invention.

Aspects of the present embodiments provide for a semiconductor device including a gate-all-around (GAA) based non-volatile memory (NVM) device. For example, the GAA based NVM device can include dual control gates. The dual control gates can have higher coupling ratio and lower voltage cell operation. The embodiments described herein can enlarge the surface area between a control and a floating gate. Reduced floating gate to floating gate interference can be achieved by control gate shielding at two sides. The floating gate can sit vertically, thereby achieving improved floating gate scalability in the planar direction. Due to a negligible amount of floating gate crosstalk, the NVM can be stacked as, e.g., three-dimensional (3D) NAND flash memory, to enhance density. Additionally, although most NVM technologies are combined at back-end-of-line (BEOL) processing, the embodiments described herein can be co-integrated with nanosheet FET devices in FEOL processes, which can reduce costs associated with, e.g., performance degradation due to thermal budget limitation high power consumption and oxidation, and can further improve scalability.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIG. 1 shows a cross-sectional view of a semiconductor device 100 including a non-volatile memory (NVM) device having dual control gates in accordance with an illustrative embodiment. The cross-section of FIG. 1 is taken across fins through a given one of the control gates. Illustratively, the device 100 includes a flash memory device, although the embodiments described herein should not be considered limited to flash memory, and can be applied to fabricate other suitable NVM devices.

As shown, the device 100 includes a substrate 102. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The device 100 further includes semiconductor material of the fins forming gate-all-around field-effect transistor (GAA FET) channels 110 of the device 100. In one embodiment, the GAA FET channels 110 are formed from a stack of nanosheets. The GAA FET channels 110 can include any suitable material in accordance with the embodiments described herein (e.g., Si).

The GAA FET channels 110 are shown surrounded by dielectric material 120 forming isolated channels. In one embodiment, the dielectric material 120 can include an oxide material. For example, the dielectric material 120 can include silicon dioxide ($SiO_2$). However, the dielectric material 120 can include any suitable material in accordance with the embodiments described herein.

As furthershown, the device 100 includes a control gate 130-1 formed transversely across the fins of the device 100 and surrounding the dielectric material 120. The control gate 130-1 can include any suitable material in accordance with the embodiments described herein (e.g., polysilicon material). Thus, the dielectric material 120 include an inter-poly dielectric (IPD) and/or tunneling oxide separating the GAA FET channels 110 from the control gate 130-1.

Figure 2:
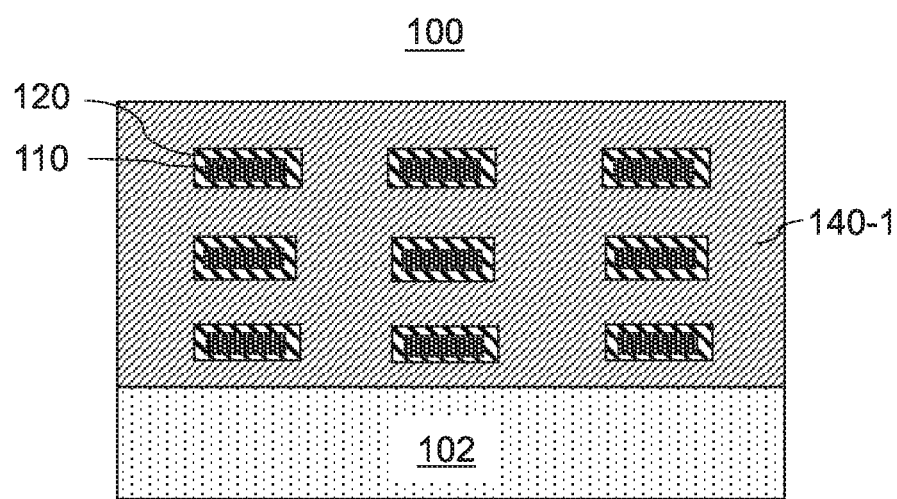
FIG. 2 is a cross-sectional view of the semiconductor device taken transversely across fins through a floating gate, in accordance with an embodiment of the present invention.

Referring to FIG. 2, a cross-sectional view of the device 100 is shown in accordance with an illustrative embodiment. The cross-sectional view of FIG. 2 is similar to that of FIG. 1, except that the cross-section is taken across the fins of the device 100 through a floating gate 140-1 formed transversely across the fins of the device and surrounding the dielectric material 120. The floating gate 140-1 can include any suitable material in accordance with the embodiments described herein (e.g., polysilicon material). Thus, the dielectric material 120 can include a tunneling oxide layer separating the GAA FET channels 110 from the floating gate 140-1.

Figure 3:
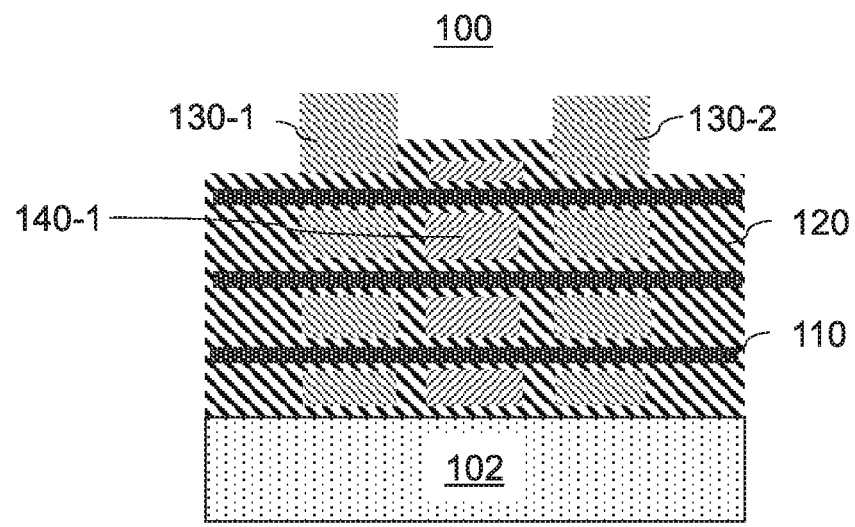
FIG. 3 is a cross-sectional view of the semiconductor device taken transversely across floating gates and control gates through a fin, in accordance with an embodiment of the present invention.

Referring to FIG. 3, a cross-sectional view of the device 100 is shown in accordance with an illustrative embodiment. The cross-sectional view of FIG. 3 is taken transversely across control gates 130-1 and 130-2 and floating gate 140-1 of the device 100 through a given one of the fins of the device 100. In this illustrative embodiment, as shown, the floating gate 140-1 is sandwiched between the control gates 130-1 and 130-2. The dielectric material 120 can include tunnel dielectric material (e.g., a tunnel oxide) located in the gaps between the floating gate 140-1 and the GAA FET channels 110.

Although the tunnel dielectric material and IPD are shown in this illustrative embodiment being formed from the same dielectric material 120, in alternative embodiments, the tunnel dielectric material and IPD can be formed from different dielectric materials or combinations of dielectric materials.

Figure 4:
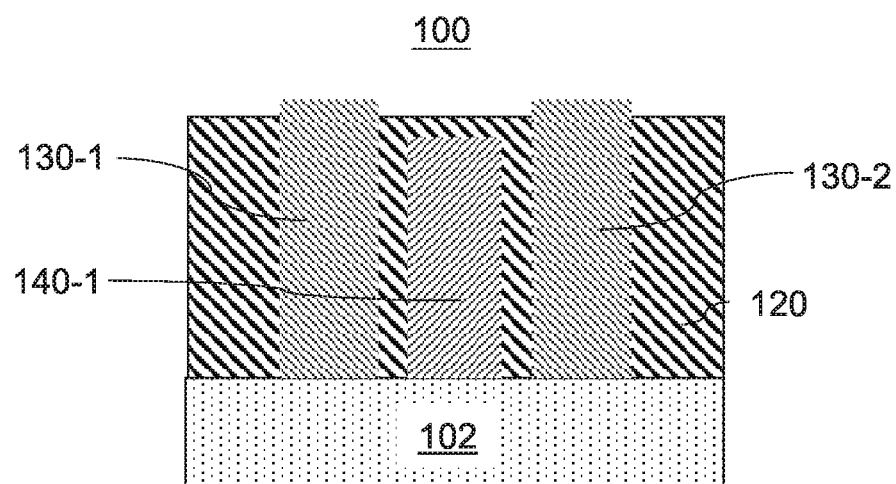
FIG. 4 is a cross-sectional view of the semiconductor device taken transversely across floating gates and control gates through a region between adjacent fins, in accordance with an embodiment of the present invention.

Referring to FIG. 4, a cross-sectional view of the device 100 is shown in accordance with an illustrative embodiment. The cross-sectional view of FIG. 4 is taken transversely across the control gates 130-1 and 130-2 and the floating gate 140-1 and through a region between adjacent fins of the device 100. Accordingly, the cross-sectional view shown in FIG. 4 does not include the GAA FET channels 110.

Figure 5:
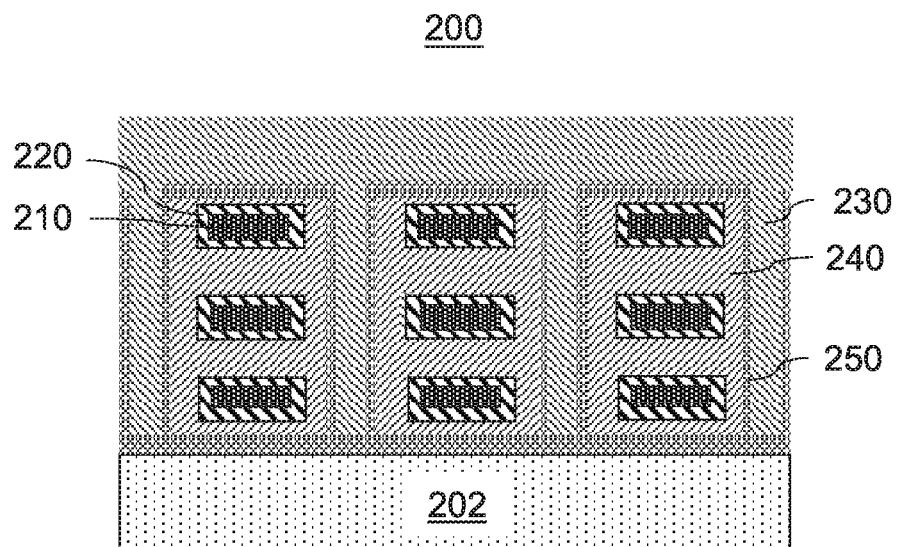
FIG. 5 is a cross-sectional view of a semiconductor device taken transversely across fins through a control gate, in accordance with another embodiment of the present invention.

Referring to FIG. 5, a cross-sectional view of a semiconductor device 200 including a non-volatile memory (NVM) device having a floating gate merged within a single control gate is shown in accordance with an illustrative embodiment. The cross-sectional view of FIG. 5 is taken across fins through the control gate. Illustratively, the device 200 includes a flash memory device, although the embodiments described herein should not be considered limited to flash memory, and can be applied to fabricate other suitable NVM devices.

As shown, the device 200 includes a substrate 202. The substrate 202 can include any suitable substrate structure, e.g., a bulk semiconductor, a semiconductor-on-insulator (SOI) substrate, etc. In one example, the substrate 202 can include a silicon-containing material. Illustrative examples of Si-containing materials suitable for the substrate 202 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The device 200 further includes semiconductor material of the fins forming gate-all-around field-effect transistor (GAA FET) channels 210 of the device 200. In one embodiment, the GAA FET channels 210 are formed from a stack of nanosheets. The GAA FET channels 210 can include any suitable material in accordance with the embodiments described herein (e.g., Si).

The GAA FET channels 210 are shown surrounded by dielectric material 220 forming isolated channels. In one embodiment, the dielectric material 220 can include an oxide material. For example, the dielectric material 220 can include silicon dioxide ($SiO_2$). However, the dielectric material 220 can include any suitable material in accordance with the embodiments described herein.

As further shown, the device 200 includes a control gate 230 and a floating gate 240. The control gate 230 and floating gate 240 can include any suitable material in accordance with the embodiments described herein (e.g., polysilicon material). The control gate 230 and floating gate 240 are separated from each other and from the substrate 202 by dielectric material 250. The dielectric material 250 can include any suitable material in accordance with the embodiments described herein. For example, the dielectric material 250 can include an oxide material (e.g., $SiO_2$).

Figure 6:
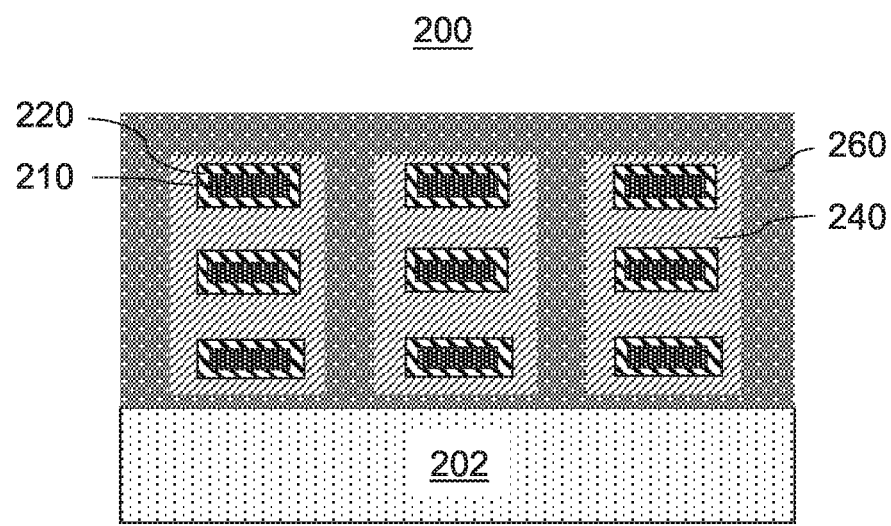
FIG. 6 is a cross-sectional view of the semiconductor device taken transversely across fins through a floating gate, in accordance with another embodiment of the present invention.

Referring to FIG. 6, a cross-sectional view of the device 200 is shown in accordance with an illustrative embodiment. The cross-sectional view of FIG. 6 is taken in a region located between portions of the control gate 230. As shown, the device includes an interlevel dielectric (ILD) 260 disposed on the substrate 202 to fill the gaps within the floating gate 240. The ILD 260 can include any suitable material in accordance with the embodiments described herein (e.g., $SiO_2$).

Figure 7:
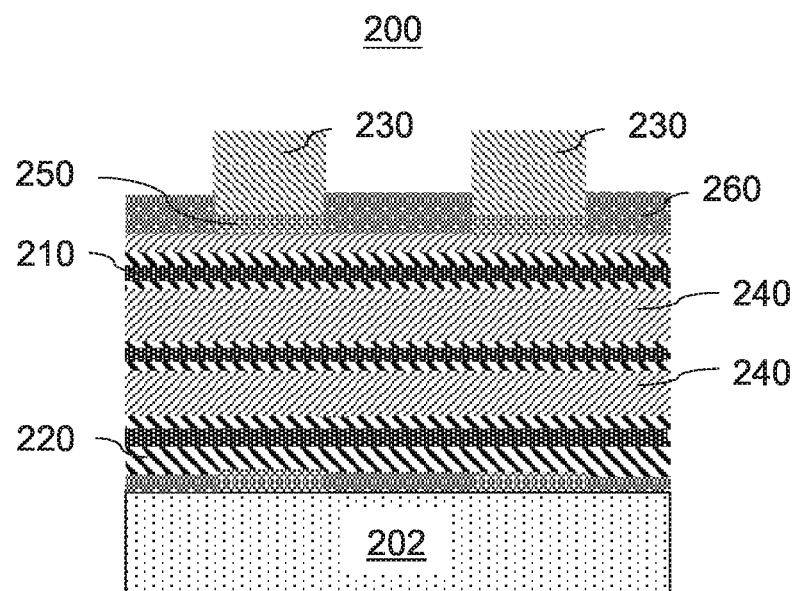
FIG. 7 is a cross-sectional view of the semiconductor device taken transversely across floating gates and control gates through a fin, in accordance with another embodiment of the present invention.

Referring to FIG. 7, a cross-sectional view of the device 200 is shown in accordance with an illustrative embodiment. The cross-sectional view of FIG. 7 is taken transversely across the control gate 230 and through a given one of the fins of the device 200.

Figure 8:
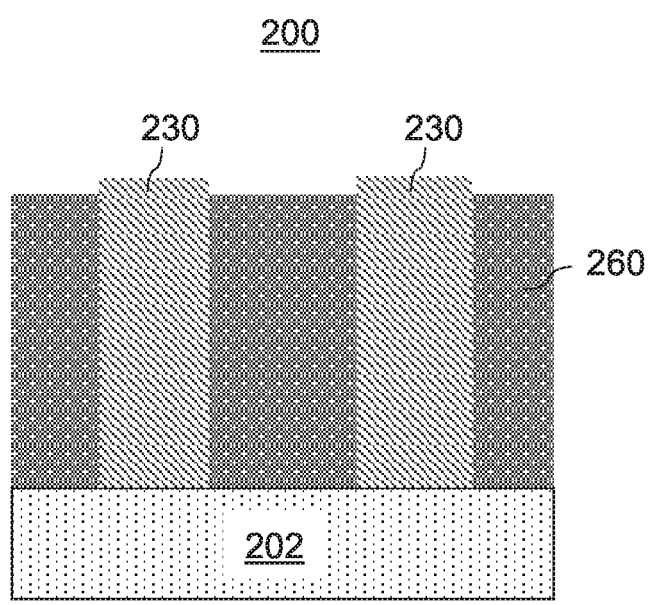
FIG. 8 is a cross-sectional view of the semiconductor device taken transversely across floating gates and control gates through a region between adjacent fins, in accordance with another embodiment of the present invention.

Referring to FIG. 8, a cross-sectional view of the device 200 is shown in accordance with an illustrative embodiment. The cross-sectional view of FIG. 8 is taken transversely across the control gate 230 and through a region between adjacent fins of the device 200. Accordingly, the cross-sectional view shown in FIG. 8 does not include the GAA FET channels 210.

Figure 9:
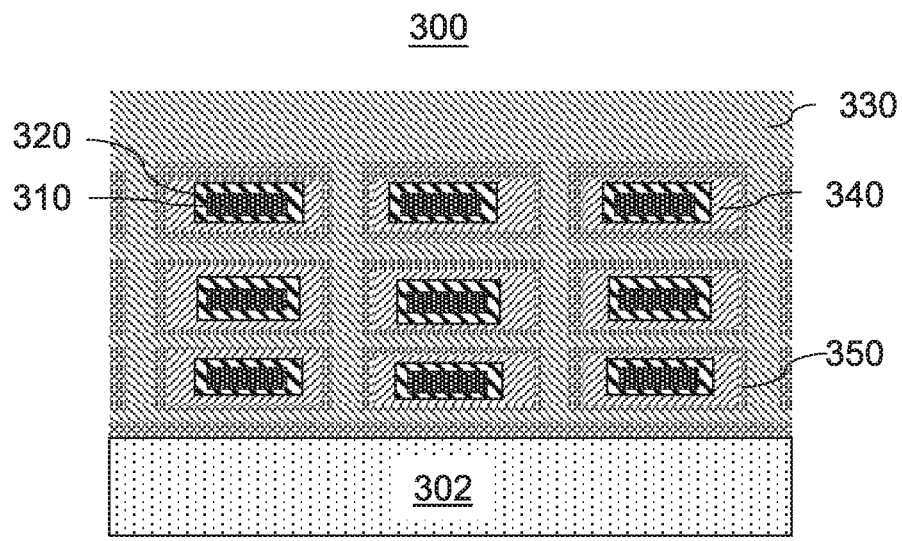
FIG. 9 is a cross-sectional view of a semiconductor device taken transversely across fins through a control gate, in accordance with yet another embodiment of the present invention.

Referring to FIG. 9, a cross-sectional view of a semiconductor device 300 including a non-volatile memory (NVM) device having multiple floating gates and a single control gate is shown in accordance with an illustrative embodiment. The cross-sectional view of FIG. 9 is taken across fins through the control gate. Illustratively, the device 300 includes a flash memory device, although the embodiments described herein should not be considered limited to flash memory, and can be applied to fabricate other suitable NVM devices.

As shown, the device 300 includes a substrate 302. The substrate 302 can include any suitable substrate structure, e.g., a bulk semiconductor, a semiconductor-on-insulator (SOI) substrate, etc. In one example, the substrate 302 can include a silicon-containing material. Illustrative examples of Si-containing materials suitable for the substrate 302 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The device 300 further includes semiconductor material of the fins forming gate-all-around field-effect transistor (GAA FET) channels 310 of the device 300. In one embodiment, the GAA FET channels 310 are formed from a stack of nanosheets. The GAA FET channels 310 can include any suitable material in accordance with the embodiments described herein (e.g., Si).

The GAA FET channels 310 are shown surrounded by dielectric material 320 forming isolated channels. In one embodiment, the dielectric material 320 can include an oxide material. For example, the dielectric material 320 can include silicon dioxide ($SiO_2$). However, the dielectric material 320 can include any suitable material in accordance with the embodiments described herein.

As further shown, the device 300 includes a control gate 330-1 and floating gate 340. The control gate 330-1 and floating gates 340 can include any suitable material in accordance with the embodiments described herein (e.g., polysilicon material). The control gate 330-1 and floating gates 340 are separated from each other and from the substrate 302 by dielectric material 350. The dielectric material 350 is similar to the dielectric material 250 described above with reference to FIG. 5.

Figure 10:
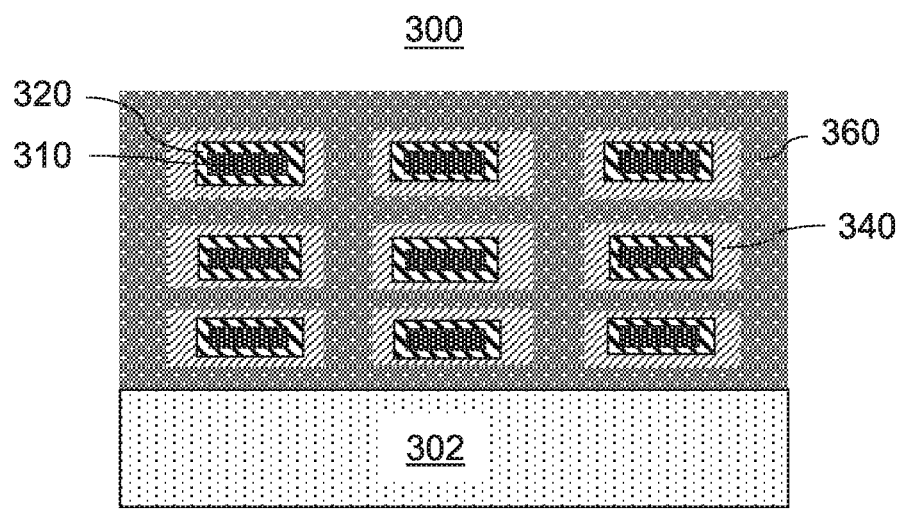
FIG. 10 is a cross-sectional view of the semiconductor device taken transversely across fins through a floating gate, in accordance with yet another embodiment of the present invention.

Referring to FIG. 10, a cross-sectional view of the device 300 is shown in accordance with an illustrative embodiment. The cross-sectional view of FIG. 10 is taken in a region located between the control gate 330-1 and another control gate 330-2. As shown, the device includes an ILD 360 disposed on the substrate 302 to fill the gaps between the floating gates 340. The ILD 360 can include any suitable material in accordance with the embodiments described herein (e.g., $SiO_2$).

Figure 11:
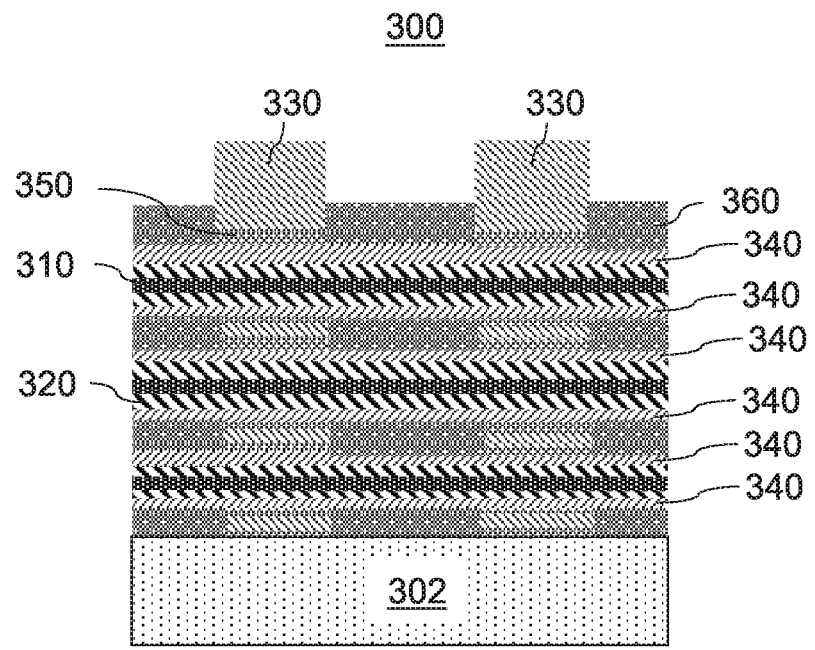
FIG. 11 is a cross-sectional view of the semiconductor device taken transversely across floating gates and control gates through a fin, in accordance with yet another embodiment of the present invention.

Referring to FIG. 11, a cross-sectional view of the device 300 is shown in accordance with an illustrative embodiment. The cross-sectional view of FIG. 11 is taken transversely across control gates 330-1 and 330-2 of the device 300 and through a given one of the fins of the device 300.

Figure 12:
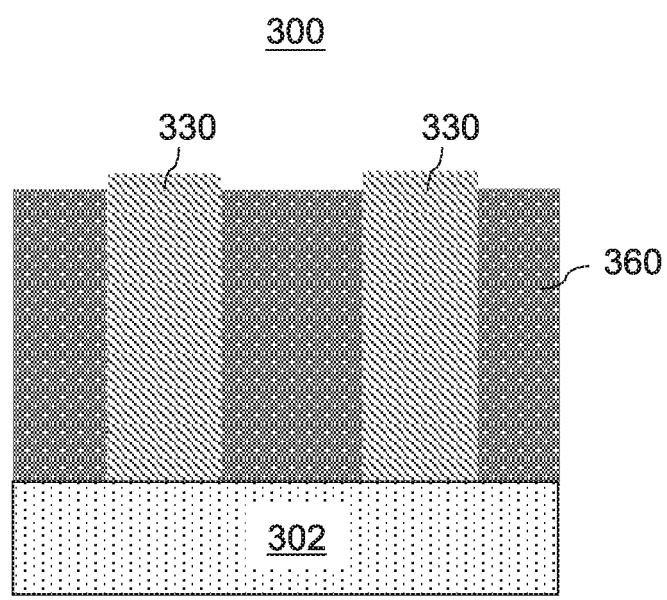
FIG. 12 is a cross-sectional view of the semiconductor device taken transversely across floating gates and control gates through a region between adjacent fins, in accordance with yet another embodiment of the present invention.

Referring to FIG. 12, a cross-sectional view of the device 300 is shown in accordance with an illustrative embodiment. The cross-sectional view of FIG. 12 is taken transversely across the control gates 330-1 and 330-2 and through a region between adjacent fins of the device 300. Accordingly, the cross-sectional view shown in FIG. 12 does not include the GAA FET channels 310.

FIGS. 13-16 depict respective steps of a process flow for fabricating a semiconductor device 400 including a gate-all-around field-effect transistor (GAA FET) based non-volatile memory (NVM) device, in accordance with an embodiment of the present invention (e.g., device 100 of FIGS. 1-4). FIGS. 13, 14, 17 and 18 depict respective steps of a process flow for fabricating a semiconductor device 500 including a GAA FET based NVM device, in accordance with another embodiment of the present invention (e.g., device 200 of FIGS. 5-8). FIGS. 13, 14, 19 and 20 depict respective steps of a process flow for fabricating a semiconductor device 600 including a GAA FET based NVM device, in accordance with yet another embodiment of the present invention (e.g., device 300 of FIGS. 9-12).

Figure 13:
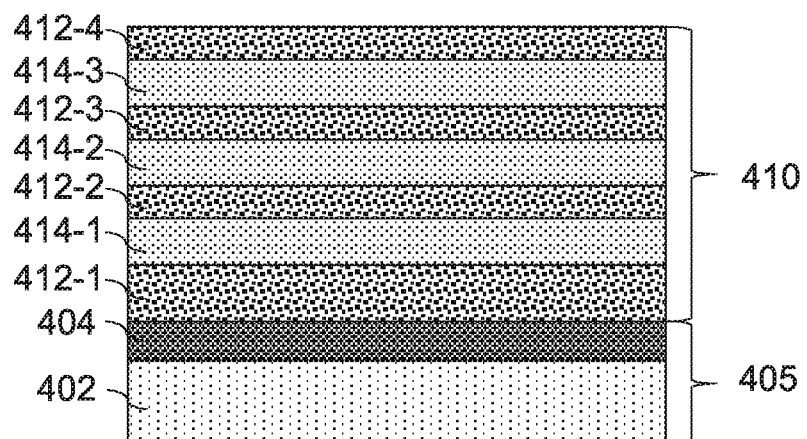
FIG. 13 is a cross-sectional view of a stack formed on a base structure during the fabrication of the semiconductor device, in accordance with an embodiment of the present invention.

Referring to FIG. 13, a stack 410 including layers of semiconductor material is formed on a base structure 405 of a device 400. As shown, the base structure 405 can include a substrate 402 (e.g., Si substrate) and a buffer layer 404 (e.g., Ge buffer layer) formed on the substrate 402. The stack 410 can include a plurality of nanosheets. As shown, the stack 410 can include a plurality of alternating layers 412-1, 414-1, 412-2, 414-2, 412-3, 414-3 and 412-4. In one embodiment, the layers 412-1 through 412-4 include SiGe and the layers 414-1 through 414-3 include Si. One or more of the layers of the stack 410 can be formed via epitaxial growth.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Figure 14:
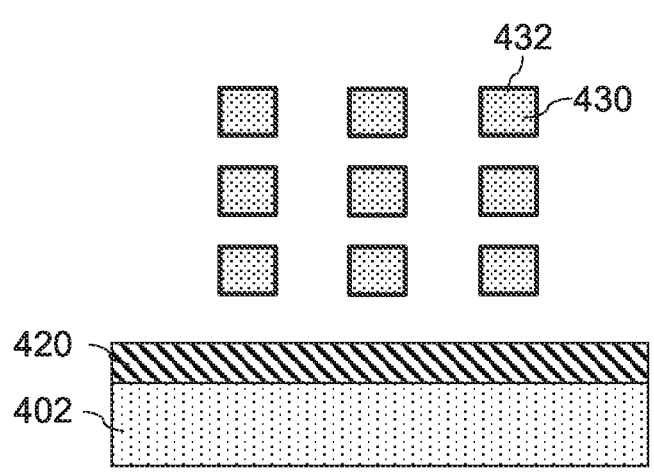
FIG. 14 is a cross-sectional view of processing performed to form tunnel dielectric layers around channels of a gate-all-around (GAA) transistor device during the fabrication of the semiconductor device, in accordance with an embodiment of the present invention.

Referring to FIG. 14, processing is performed to create GAA FET channels 430 for the device 400. The processing can include performing a fin etch process (e.g., reactive-ion etching (RIE)), removing the buffer layer 404, forming an ILD 420 and performing a selective etch to remove material from the layers of the stack 410 to create the GAA FET channels 430 from the layers 414-1 through 414-3. Then, the GAA FET channels 430 are isolated by forming tunnel dielectric material 432 around each of the GAA FET channels 430. In one embodiment, the tunnel dielectric material 432 is formed via oxidation (e.g., nanosheet oxidation). The tunnel dielectric material 432 can include any suitable material in accordance with the embodiments described herein, such as, e.g., an oxide material (e.g., $SiO_2$).

Figure 15:
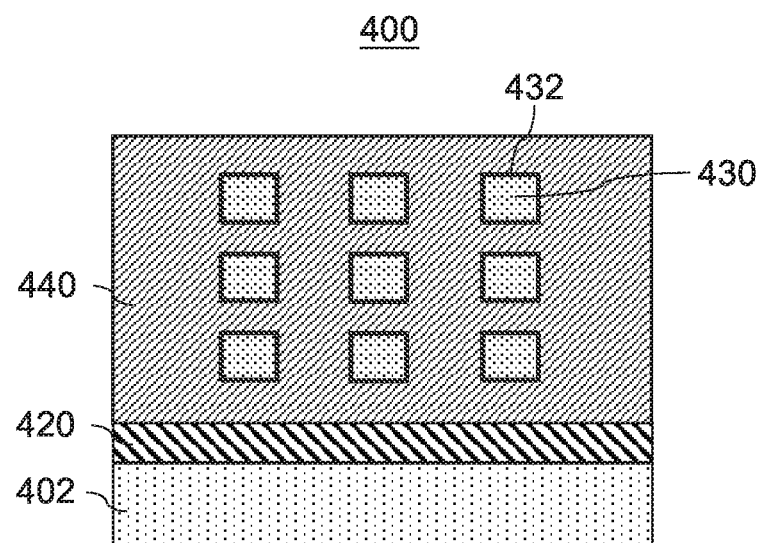
FIG. 15 is a cross-sectional view of floating gate processing performed during the fabrication of the semiconductor device, in accordance with an embodiment of the present invention.

FIG. 15 depicts the formation of a floating gate 440 as viewed through a cross-section view of the floating gate 440. Forming the floating gate 440 can include forming a first protective layer (not shown), performing an etch process on the first dielectric layer using a floating gate patterning mask (not shown), forming floating gate material (e.g., polysilicon) of the floating gate 440 to surround the dielectric material 432, and removing/stripping the floating gate patterning mask and the protective layer.

The first protective layer functions to protect the dielectric material 432 during the formation of the floating gate 440. The first protective layer can include a dielectric material different from the dielectric material 432 so that the removal of the first protective layer (e.g., via an etch process) stops at the dielectric material 432. In one embodiment, the first protective layer includes a silicon nitride material, such as, e.g., $Si_3N_4$. However, any suitable material can be used for the protective layer in accordance with the embodiments described herein.

Figure 16:
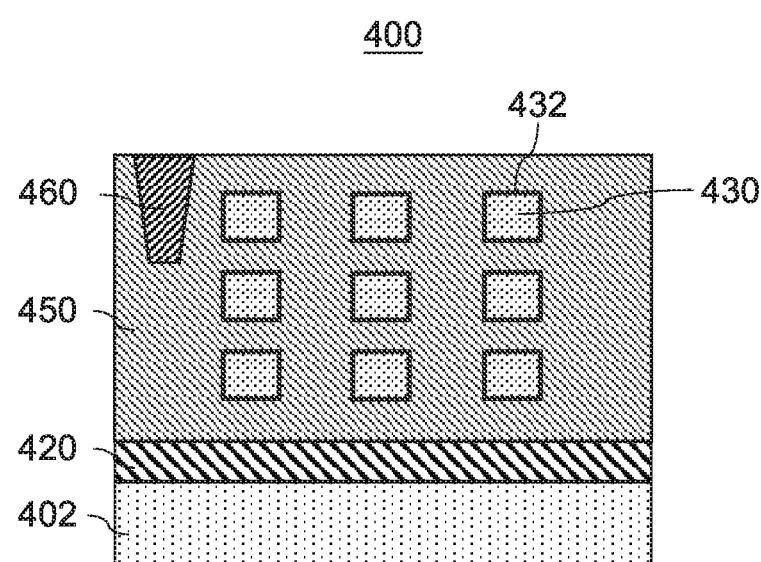
FIG. 16 is a cross-sectional view of contact gate processing performed during the fabrication of the semiconductor device, in accordance with an embodiment of the present invention.

FIG. 16 depicts the formation of a control gate 450 as viewed through a cross-section of the control gate 450. Forming the control gate 450 can include forming a second protective layer (not shown), performing an etch process on the dielectric layer using a control gate patterning mask (not shown), forming control gate material (e.g., polysilicon) of the control gate 450 to surround the dielectric material 432, and removing/stripping the control gate patterning mask and the second protective layer.

The second protective layer functions to protect the dielectric material 432. In one embodiment, the second dielectric layer includes a silicon oxide material, such as, e.g., $SiO_2$. However, any suitable material can be used in accordance with the embodiments described herein.

As further shown, further processing can be performed to create floating gate and control gate contacts, including contact 460. The contact 460 can include any suitable material in accordance with the embodiments described herein. For example, the contact 460 can include tungsten (W).

Figure 17:
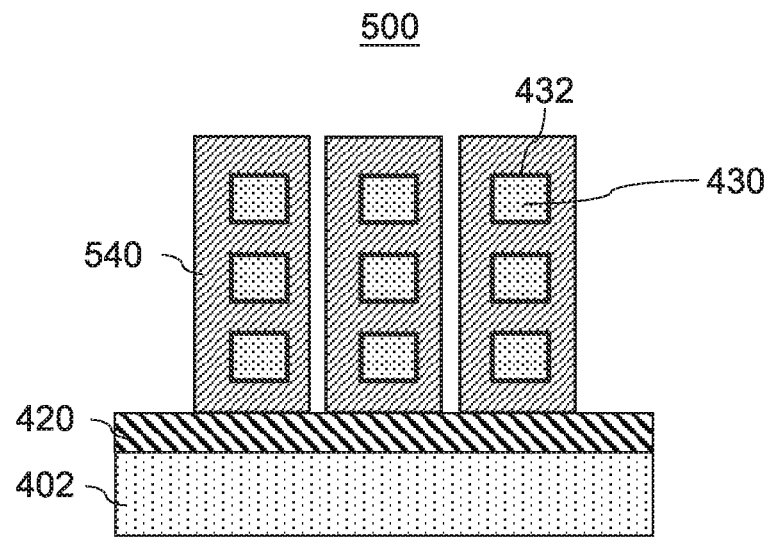
FIG. 17 is a cross-sectional view of floating gate processing performed during the fabrication of the semiconductor device, in accordance with another embodiment of the present invention.

FIG. 17 depicts the formation of a floating gate 540 for a device 500 as viewed through a cross-section view of the floating gate 540. It is assumed that the device has underwent processing similar to that described above with reference to FIGS. 13 and 14. Forming the floating gate 540 can include conformally depositing portions of the floating gate material (e.g., polysilicon) to surround the dielectric material 432. As shown in FIG. 17, the device 500 includes portions of floating gate material conformally deposited over respective groups of the channels.

Figure 18:
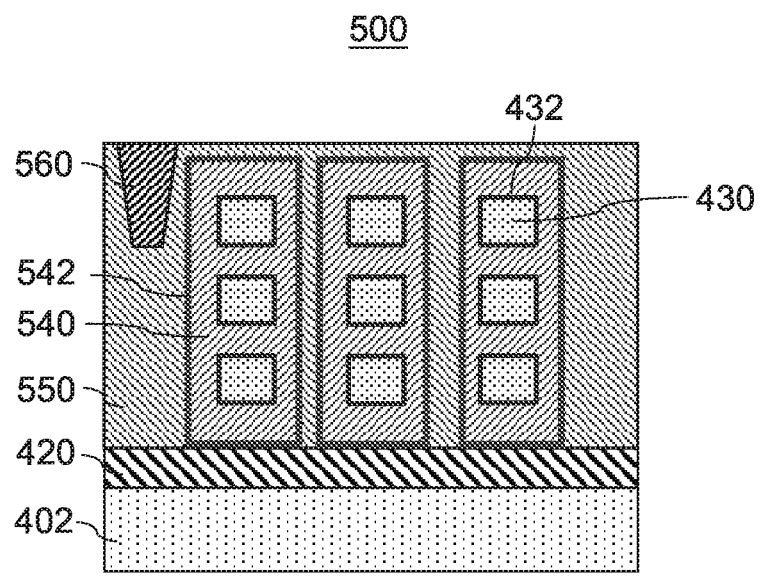
FIG. 18 is a cross-sectional view of contact gate processing performed during the fabrication of the semiconductor device, in accordance with another embodiment of the present invention.

FIG. 18 depicts the formation of a control gate 550 as viewed through a cross-section of the control gate 550. Forming the control gate 550 can include forming a second dielectric layer 542 which can include, e.g., silicon oxide ($SiO_2$), forming control gate material (e.g., polysilicon) of the control gate 550 to surround the dielectric layer 542. As shown, the dielectric layer 542 can be conformally formed on the floating gate material.

After the control gate 550 is formed, further processing can be performed to create floating gate and control gate contacts, including contact 560. The contact 560 can include any suitable material in accordance with the embodiments described herein. For example, the contact 560 can include W.

Figure 19:
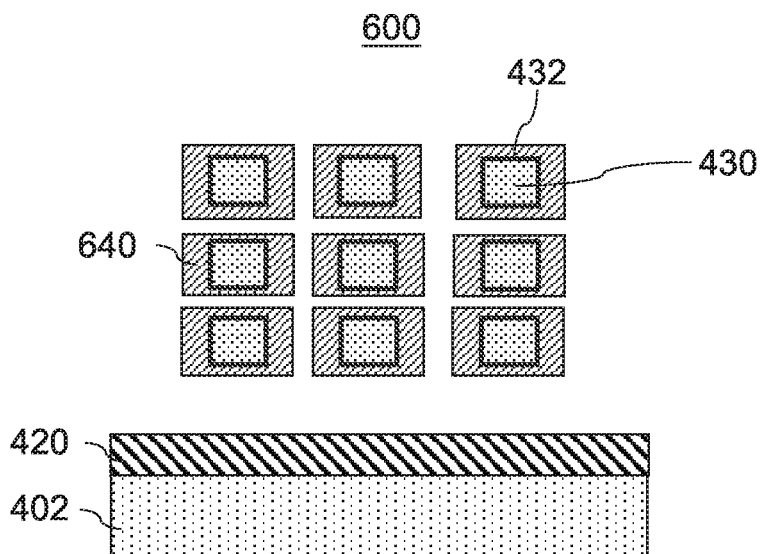
FIG. 19 is a cross-sectional view of floating gate processing performed during the fabrication of the semiconductor device, in accordance with yet another embodiment of the present invention.

FIG. 19 depicts the formation of a floating gate 640 for a device 600 as viewed through a cross-section view of the floating gate 640. It is assumed that the device has underwent processing similar to that described above with reference to FIGS. 13 and 14. Similar to device 500 described above with reference to FIG. 17, the floating gate 640 can include conformally depositing floating gate material (e.g., polysilicon) to surround the dielectric material 432. However, as shown in FIG. 19, the device 600 includes portions of floating gate material conformally deposited over each individual channel, as opposed to groups of channels.

Figure 20:
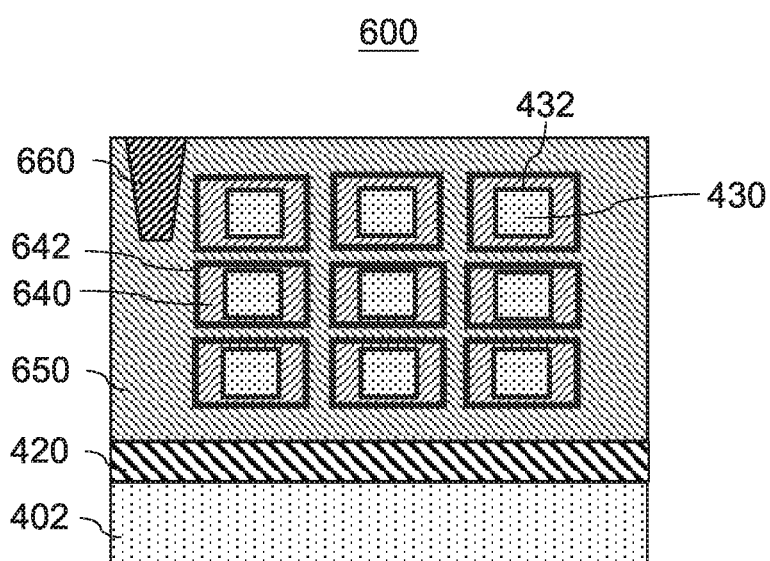
FIG. 20 is a cross-sectional view of contact gate processing performed during the fabrication of the semiconductor device, in accordance with yet another embodiment of the present invention.

FIG. 20 depicts the formation of a control gate 650 as viewed through a cross-section of the control gate 650. Forming the control gate 650 can include forming a second dielectric layer 642 which can include, e.g., silicon oxide ($SiO_2$), and forming control gate material (e.g., polysilicon) of the control gate 650 to surround the dielectric layer 642.

As shown, the dielectric layer 642 can be conformally formed on the floating gate material.

After the control gate 650 is formed, further processing can be performed to create floating gate and control gate contacts, including contact 660. The contact 660 can include any suitable material in accordance with the embodiments described herein. For example, the contact 660 can include W.

Having described preferred embodiments of gate-all-around transistor based non-volatile memory devices and a method of fabricating gate-all-around transistor based non-volatile memory devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A method for fabricating a semiconductor device including a gate-all-around field-effect transistor (GAA PET) based non-volatile memory device, comprising:
    forming gate-all-around field effect transistor (GAA PET) channels;
    depositing tunnel dielectric material around the GAA FET channels to isolate the GAA ITT channels;
    forming a floating gate, including depositing first gate material over the isolated GAA FET channels; and
    forming at least one control gate, including depositing second gate material over the isolated GAA FET channels.

2. The method of claim 1, further comprising forming a stack including alternating layers of first and second semiconductor materials disposed on a base structure.

3. The method of claim 2, further comprising forming the base structure, including forming a buffer layer on a substrate.

4. The method of claim 3, wherein forming the GAA FET channels further includes:
    removing the buffer layer;
    forming an interlevel dielectric (ILD) layer on the substrate to create a bottom isolation layer; and
    selectively etching the stack to form the GAA FET channels.

5. The method of claim 1, wherein forming the floating gate further comprises:
    forming a first interlevel dielectric (ILD) layer;
    etching the first ILD layer to create first gaps; and
    filling the first gaps with the first gate material.

6. The method of claim 5, wherein forming the at least one control gate further comprises:
    removing the first ILD layer;
    forming a second layer;
    etching the second ILD layer to create second gaps; and
    filling the second gaps with the second gate material.

7. The method of claim 1, wherein forming the floating gate further comprises:
    forming a first interlevel dielectric (ILD) layer; and
    conformally depositing portions of the first gate material, each portion corresponding to at least one of the isolated GAA FET channels.

8. The method of claim 7, wherein forming the at least one control gate further comprises:
    conformally forming a second ILD layer over the portions of the floating gate material; and
    filling gaps between the second ILD layer with the second gate material.

9. The method of claim 1, further comprising forming at least one gate contact.

* * * * *